(12) United States Patent
Huang et al.

(10) Patent No.: US 10,515,852 B2
(45) Date of Patent: Dec. 24, 2019

(54) STRUCTURE AND FORMATION METHOD OF SEMICONDUCTOR DEVICE WITH RESISTIVE ELEMENT

(71) Applicant: Taiwan Semiconductor Manufacturing Co., Ltd., Hsinchu (TW)

(72) Inventors: Wen-Sheh Huang, Hsinchu (TW); Hsiu-Wen Hsueh, Taichung (TW); Yu-Hsiang Chen, Hsinchu (TW); Chii-Ping Chen, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/865,845

(22) Filed: Jan. 9, 2018

(65) Prior Publication Data

US 2019/0139826 A1    May 9, 2019

Related U.S. Application Data

(60) Provisional application No. 62/583,753, filed on Nov. 9, 2017.

(51) Int. Cl.
| | |
|---|---|
| *H01L 21/768* | (2006.01) |
| *H01L 21/762* | (2006.01) |
| *H01L 27/06* | (2006.01) |
| *H01L 21/311* | (2006.01) |

(52) U.S. Cl.
CPC .. *H01L 21/76898* (2013.01); *H01L 21/31105* (2013.01); *H01L 21/762* (2013.01); *H01L 21/76811* (2013.01); *H01L 27/0629* (2013.01)

(58) Field of Classification Search
CPC ......... H01L 21/76898; H01L 21/31105; H01L 21/762; H01L 21/76811; H01L 27/0629
See application file for complete search history.

(56) References Cited

U.S. PATENT DOCUMENTS

| | | | | |
|---|---|---|---|---|
| 5,854,510 A | * | 12/1998 | Sur, Jr. ............... | H01L 23/5256 257/529 |
| 6,258,713 B1 | * | 7/2001 | Yu ..................... | H01L 21/76849 257/E21.584 |
| 6,566,171 B1 | * | 5/2003 | Liu ..................... | H01L 23/5258 257/E23.15 |

(Continued)

OTHER PUBLICATIONS

U.S. Office Action, dated Jan. 7, 2019, for U.S. Appl. No. 15/599,687.

*Primary Examiner* — Mark W Tornow
(74) *Attorney, Agent, or Firm* — Birch, Stewart, Kolasch & Birch, LLP

(57) ABSTRACT

Structures and formation methods of a semiconductor device are provided. The semiconductor device structure includes a semiconductor substrate and a first dielectric layer over the semiconductor substrate. The semiconductor device structure also includes a conductive feature in the first dielectric layer and a second dielectric layer over the first dielectric layer. The semiconductor device structure further includes a resistive element electrically connected to the conductive feature. A first portion of the resistive element is over the dielectric layer, and a second portion of the resistive element extends towards the conductive feature.

20 Claims, 17 Drawing Sheets

(56) References Cited

U.S. PATENT DOCUMENTS

| | | | |
|---|---|---|---|
| 6,876,082 B2 * | 4/2005 | Lee | H01L 21/2855 |
| | | | 257/741 |
| 7,388,291 B2 * | 6/2008 | Kurokawa | H01L 21/288 |
| | | | 257/758 |
| 8,563,336 B2 * | 10/2013 | Chen | H01C 7/006 |
| | | | 257/537 |
| 8,835,306 B2 * | 9/2014 | Ryan | H01L 21/76883 |
| | | | 257/E23.011 |
| 9,905,633 B1 | 2/2018 | Yang | |
| 2007/0284662 A1 | 12/2007 | Chinthakindi et al. | |
| 2011/0254165 A1 * | 10/2011 | Muranaka | H01L 21/76832 |
| | | | 257/751 |
| 2012/0112873 A1 | 5/2012 | Le Neel et al. | |
| 2012/0146186 A1 | 6/2012 | Lukaitis et al. | |

* cited by examiner

STRUCTURE AND FORMATION METHOD OF SEMICONDUCTOR DEVICE WITH RESISTIVE ELEMENT

PRIORITY CLAIM AND CROSS-REFERENCE

This Application claims the benefit of U.S. Provisional Application No. 62/583,753, filed on Nov. 9, 2017, the entirety of which is incorporated by reference herein.

BACKGROUND

The semiconductor integrated circuit (IC) industry has experienced rapid growth. Technological advances in IC materials and design have produced generations of ICs. Each generation has smaller and more complex circuits than the previous generation.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, these advances have increased the complexity of processing and manufacturing ICs. Since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
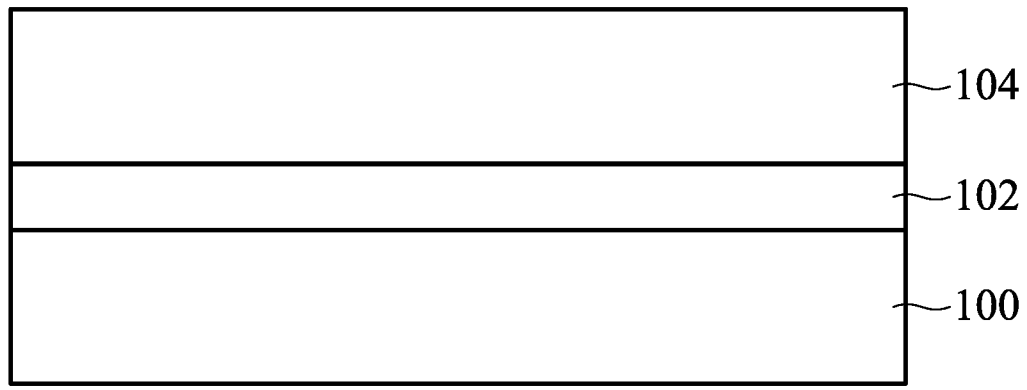
FIGS. 1A-1I are cross-sectional views of various stages of a process for forming a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

FIGS. 1A-1I are cross-sectional views of various stages of a process for forming a semiconductor device structure, in accordance with some embodiments. As shown in FIG. 1A, a semiconductor substrate 100 is received or provided. In some embodiments, the semiconductor substrate 100 is a bulk semiconductor substrate, such as a semiconductor wafer. For example, the semiconductor substrate 100 includes silicon or other elementary semiconductor materials such as germanium. In some other embodiments, the semiconductor substrate 100 includes a compound semiconductor. The compound semiconductor may include silicon carbide, gallium arsenide, indium arsenide, indium phosphide, another suitable compound semiconductor, or a combination thereof. In some embodiments, the semiconductor substrate 100 includes a semiconductor-on-insulator (SOI) substrate. The SOI substrate may be fabricated using a separation by implantation of oxygen (SIMOX) process, a wafer bonding process, another applicable method, or a combination thereof.

In some embodiments, isolation features (not shown) are formed in the semiconductor substrate 100 to define and isolate various device elements (not shown) formed in the semiconductor substrate 100. The isolation features include, for example, trench isolation (STI) features or local oxidation of silicon (LOCOS) features.

In some embodiments, various device elements are formed in and/or on the semiconductor substrate 100. Examples of the various device elements that may be formed in the semiconductor substrate 100 include transistors (e.g., metal oxide semiconductor field effect transistors (MOSFET), complementary metal oxide semiconductor (CMOS)

transistors, bipolar junction transistors (BJT), high voltage transistors, high frequency transistors, p-channel and/or n-channel field effect transistors (PFETs/NFETs), etc.), diodes, another suitable element, or a combination thereof. Various processes are performed to form the various device elements, such as deposition, etching, implantation, photolithography, annealing, planarization, one or more other applicable processes, or a combination thereof.

In some embodiments, a dielectric layer 102 is formed over the semiconductor substrate 100, as shown in FIG. 1A. The dielectric layer 102 may include multiple sub-layers. The dielectric layer 102 may be made of or include carbon-containing silicon oxide, silicon oxide, borosilicate glass (BSG), phosphoric silicate glass (PSG), borophosphosilicate glass (BPSG), fluorinated silicate glass (FSG), porous dielectric material, another suitable low-k dielectric material, one or more other suitable materials, or a combination thereof. In some embodiments, multiple conductive features (not shown) are formed in the dielectric layer 102. The conductive features may include conductive contacts, conductive lines, and/or conductive vias. The dielectric layer 102 and the conductive features formed therein are a portion of an interconnection structure that will be subsequently formed. The formation of the dielectric layer 102 and the conductive features in the dielectric layer 102 may involve multiple deposition processes, patterning processes, and planarization processes.

The device elements in and/or on the semiconductor substrate 100 will be interconnected through the interconnection structure to be formed over the semiconductor substrate 100. As a result, integrated circuit devices are formed. The integrated circuit devices may include logic devices, memory devices (e.g., static random access memories, SRAMs), radio frequency (RF) devices, input/output (I/O) devices, system-on-chip (SoC) devices, image sensor devices, one or more other applicable types of devices, or a combination thereof.

In some embodiments, a dielectric layer 104 is deposited over the semiconductor substrate 100 to surround the gate stacks 104, as shown in FIG. 1A. The dielectric layer 104 may be made of or include silicon oxide, silicon nitride, silicon oxynitride, fluoride-doped silicate glass (FSG), carbon-containing dielectric material, low-K dielectric material, one or more other suitable materials, or a combination thereof.

In some embodiments, the dielectric layer 104 is deposited using a chemical vapor deposition (CVD) process, an atomic layer deposition (ALD) process, a physical vapor deposition (PVD) process, a spin-on process, a spray coating process, one or more other applicable processes, or a combination thereof. Afterwards, a planarization process may be used to provide the deposited dielectric layer 104 with a substantially planar top surface, which facilitates subsequent patterning processes. The planarization process may include a chemical mechanical polishing (CMP) process, a dry polishing process, a mechanical grinding process, an etching process, one or more other applicable processes, or a combination thereof.

Figure 1B:
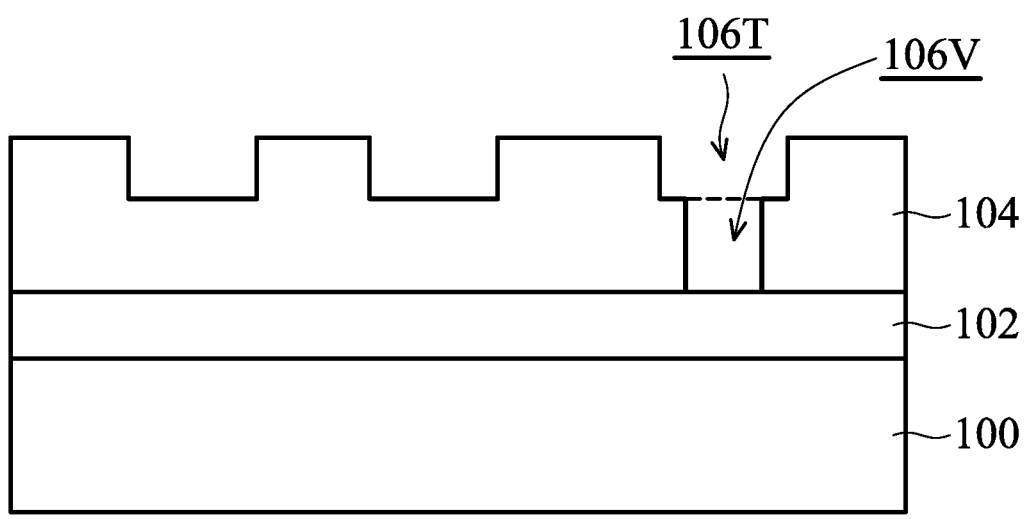

As shown in FIG. 1B, one or more trenches 106T and via holes 106V are formed in the dielectric layer 104, in accordance with some embodiments. Each of the trenches 106T may connect one of the via holes 106V. The trenches 106T are used to contain conductive lines that will be subsequently formed. The via holes 106V are used to contain conductive vias that will be subsequently formed. The formation of the trenches 106T and the via holes 106V may involve photolithography processes and etching processes.

In some embodiments, the trenches 106T are formed before the formation of the via holes 106V. In some embodiments, the trenches 106T are formed after the formation of the via holes 106V.

Figure 1C:
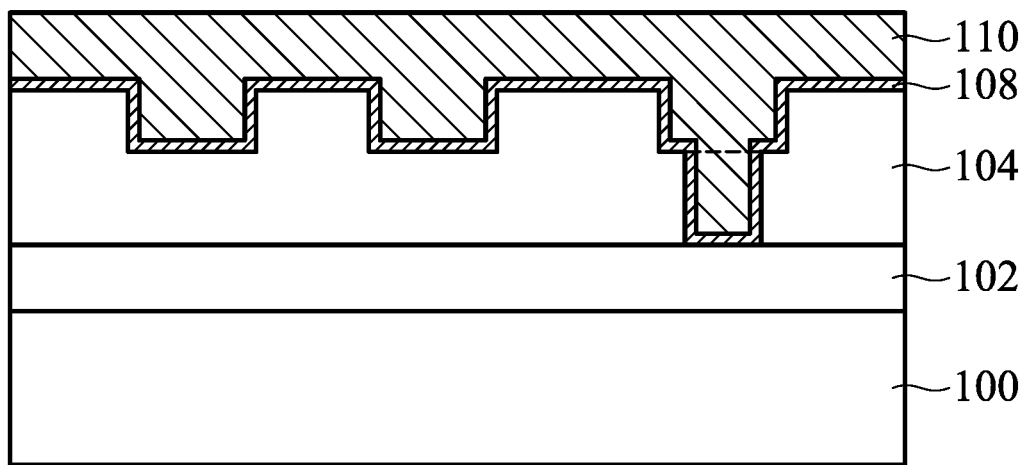

As shown in FIG. 1C, a barrier layer 108 is deposited over the dielectric layer 104, in accordance with some embodiments. The barrier layer 108 extends on sidewalls and bottom portions of the trenches 106T and the via holes 106V. In some embodiments, the barrier layer 108 conformally covers the sidewalls and bottom portions of the trenches 106T and 106V. The barrier layer 108 may be used to prevent metal ions in subsequently formed conductive lines and conductive vias from diffusing into the dielectric layer 104. The barrier layer 108 may be made of or include tantalum nitride, titanium nitride, one or more other suitable materials, or a combination thereof. The barrier layer 108 may be deposited using a CVD process, an ALD process, a PVD process, an electroplating process, an electroless plating process, one or more other applicable processes, or a combination thereof. The barrier layer 108 may have a substantially uniform thickness.

Afterwards, a conductive material 110 is deposited over the barrier layer 108 to fill the trenches 106T and the via holes 106V, as shown in FIG. 1C in accordance with some embodiments. The conductive material 110 may be made of or include copper, cobalt, tungsten, titanium, nickel, gold, platinum, graphene, one or more other suitable materials, or a combination thereof. The conductive material 110 may be deposited using a CVD process, an ALD process, a PVD process, an electroplating process, an electroless plating process, one or more other applicable processes, or a combination thereof.

Figure 1D:
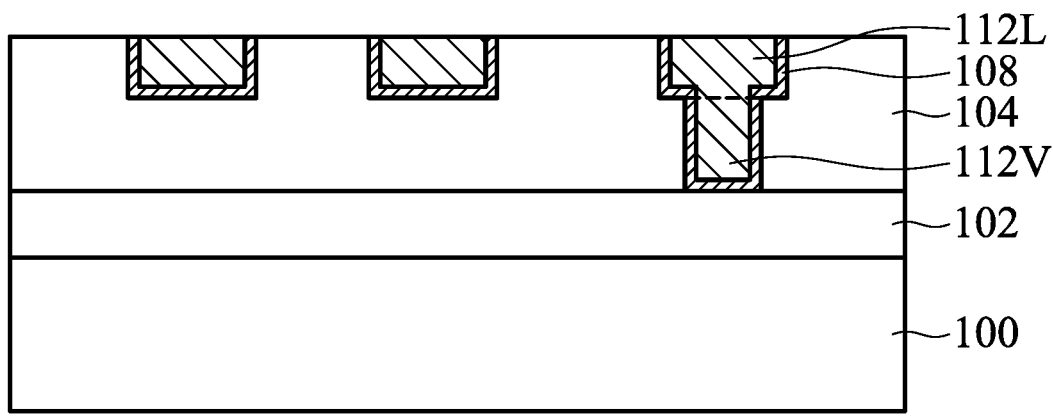

As shown in FIG. 1D, the conductive material 110 outside of the trenches 106T and the via holes 106V is removed, in accordance with some embodiments. Remaining portions of the conductive material 110 in the via holes 106V form the conductive vias 112V. In FIG. 1D, only one of the conductive vias 112V is shown. Remaining portions of the conductive material 110 in the trenches 106T form the conductive lines 112L. In some embodiments, the conductive material 110 outside of the trenches 106T and the via holes 106V is removed using a planarization process. The planarization process may include a CMP process, a dry polishing process, a mechanical grinding process, an etching process, one or more other applicable processes, or a combination thereof. After the planarization process, top surfaces of the conductive lines 112L, the barrier layer 108, and the dielectric layer 104 may be substantially coplanar. The conductive lines 112L may be one of the third to the seventh level metal lines.

Figure 1E:
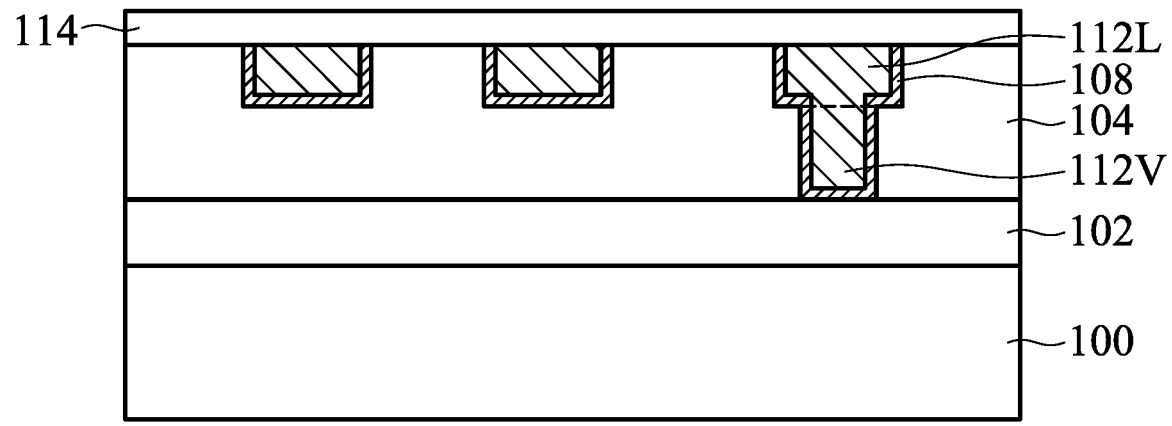

As shown in FIG. 1E, a dielectric layer 114 is deposited over the dielectric layer 104 and the conductive lines 112L, in accordance with some embodiments. In some embodiments, the dielectric layer 114 functions as an etch stop layer. In some embodiments, the dielectric layer 114 is made of a different material than that of the dielectric layer 104. In some embodiments, the dielectric layer 114 is thinner than the dielectric layer 104. The dielectric layer 114 may be made of or include silicon carbide (SiC), nitrogen-doped silicon carbide, oxygen-doped silicon carbide, silicon nitride (SiN), silicon oxynitride (SiON), silicon oxide, one or more other suitable materials, or a combination thereof. The dielectric layer 114 may be deposited using a CVD process, an ALD process, a PVD process, one or more other applicable processes, or a combination thereof.

Figure 1F:
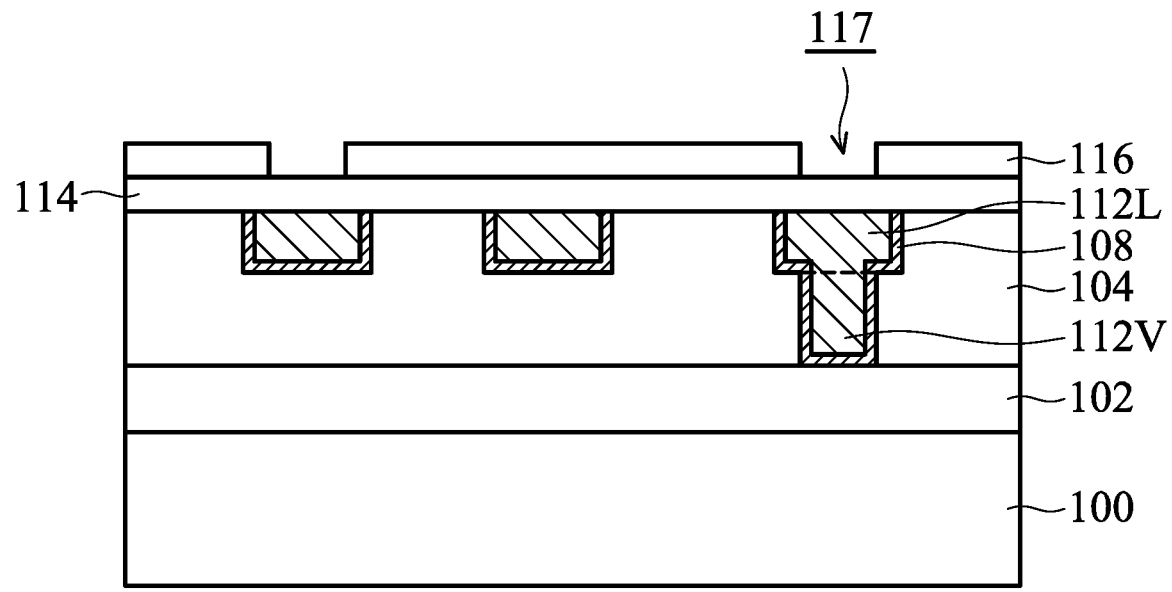

As shown in FIG. 1F, a mask element 116 is formed over the dielectric layer 114, in accordance with some embodiments. In some embodiments, the mask element 116 is a patterned photoresist layer. The mask element 116 includes one or more openings 117 that are used to define contact openings that are to be defined in the dielectric layer 114. The top view of the openings 117 may have various shapes. For example, the openings 117 may have a square shape, a rectangular shape, a circular shape, an oval shape, another suitable shape, or a combination thereof.

Figure 1G:
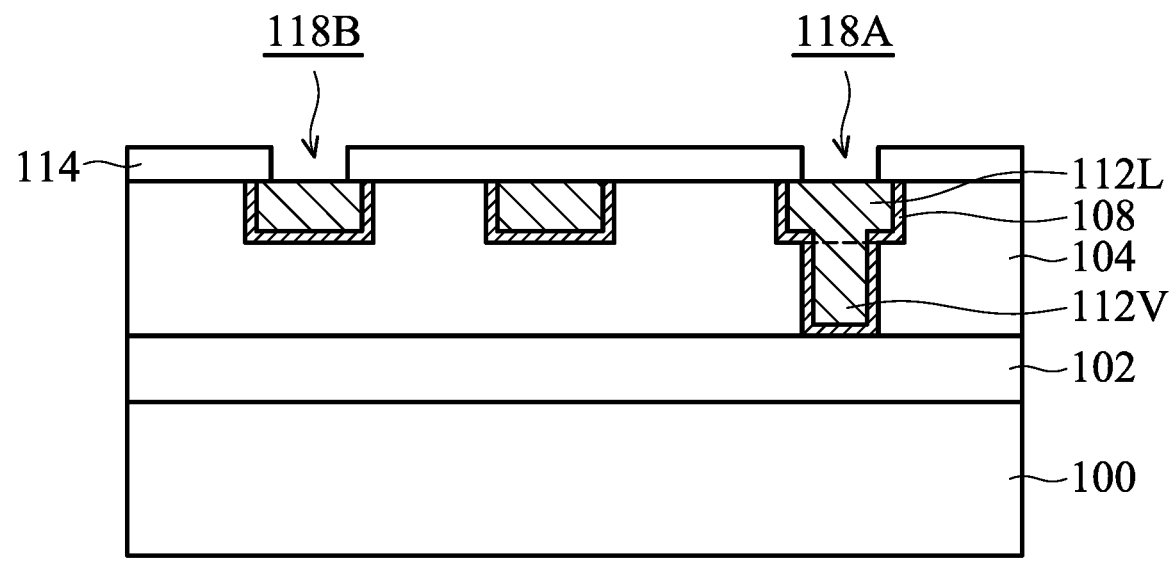

As shown in FIG. 1G, contact openings 118A and 118B are formed in the dielectric layer 114, in accordance with some embodiments. In some embodiments, each of the contact openings 118A and 118B is substantially aligned with the corresponding conductive line 112L thereunder. In some embodiments, the contact openings 118A and 118B penetrate through the dielectric layer 114 to expose conductive features formed in the dielectric layer 104. In some embodiments, the contact openings 118A and 118B expose portions of the conductive lines 112L.

In some embodiments, the contact openings 118A and 118B are formed using an etching process. The mask element 116 may be used as an etching mask. The dielectric layer 114 is partially etched through the openings 117 of the mask element 116. The pattern of the openings 117 are therefore transferred to the dielectric layer 114. Afterwards, the mask element 116 is removed. Alternatively, the mask element 116 is consumed during the formation of the contact openings 118A and 118B. In some embodiments, an independent patterning process is used to form the contact openings 118A and 118B. Therefore, the sizes, shapes, and/or positions of the contact openings 118A and 118B may be adjusted according to requirement without being limited due to the patterning of other elements.

Figure 1H:
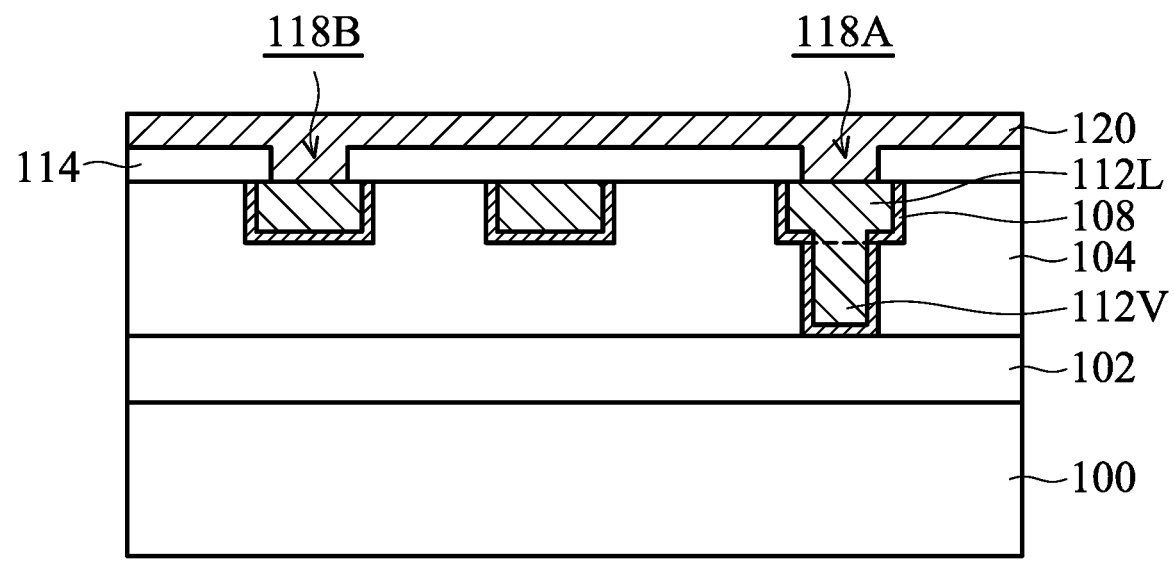

As shown in FIG. 1H, a resistive layer is deposited over the dielectric layer 114 and the conductive lines 112L, in accordance with some embodiments. In some embodiments, the resistive layer is afterwards patterned to form a resistive element 120. In some embodiments, the resistive element 120 has a substantially planar top surface, as shown in FIG. 1H. In some embodiments, the resistive element 120 extends into the contact openings 118A and 118B. The portions of the resistive element 120 extending into the contact openings 118A and 118B serve as contact portions electrically connecting the underneath conductive features, such as the conductive lines 112L. In some embodiments, the resistive element 120 covers sidewalls and bottom portions of the contact openings 118A and 118B. In some embodiments, the resistive element 120 completely fills the contact openings 118A and 118B. In some embodiments, the resistive element 120 is electrically connected to the conductive features exposed by the contact openings 118A and 118B. For example, the resistive element 120 is electrically connected to two different conductive lines 112L, as shown in FIG. 1H.

In some embodiments, the resistive element 120 is made of or includes tantalum nitride, titanium nitride, amorphous silicon, or a combination thereof. In some embodiments, the resistive element 120 is made of a nitrogen-containing material, such as tantalum nitride, titanium nitride, one or more other suitable materials, or a combination thereof. In some embodiments, the resistive element 120 has a greater atomic concentration of nitrogen than that of the barrier layer 108. In some embodiments, the barrier layer 108 is made of tantalum nitride, titanium nitride, one or more other suitable materials, or a combination thereof. However, the atomic concentration of nitrogen of the resistive element 120 is greater than that of the barrier layer 108. Therefore, the resistive element 120 may have a greater resistance than that of the barrier layer 108 or that of the conductive lines 112L.

In some embodiments, the resistive element 120 is denser than the barrier layer 108. In some embodiments, the resistive element 120 has a density that is in a range from about 12 $g/cm^3$ to about 16 $g/cm^3$. In some embodiments, the barrier layer 108 has a density that is in a range from about 10 $g/cm^3$ to about 14 $g/cm^3$.

In some embodiments, the resistive layer is deposited using a CVD process, an ALD process, a PVD process, one or more other applicable processes, or a combination thereof. The resistive layer may be patterned to form the resistive element 120 using one or more photolithography processes and etching processes.

Figure 2:
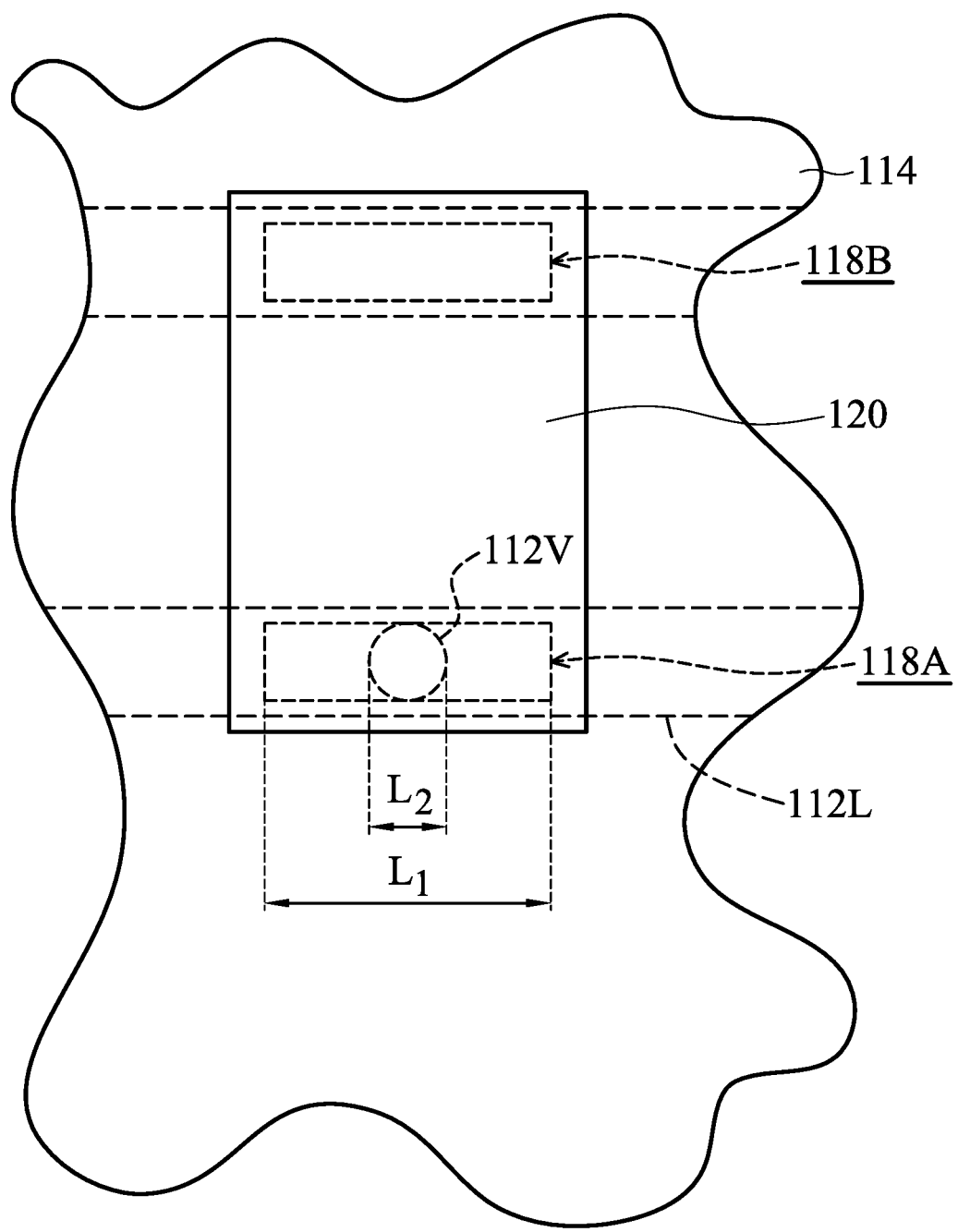
FIG. 2 is a top view of a semiconductor device structure, in accordance with some embodiments.

FIG. 2 is a top view of a semiconductor device structure, in accordance with some embodiments. FIG. 2 shows the relationship between the resistive element 120 and other elements. In some embodiments, the contact opening 118A or 118B has a length $L_1$, and the conductive via 112V has a length $L_2$, as shown in FIGS. 1H and 2. In some embodiments, the contact opening 118A or 118B is wider than the conductive via 112V below the conductive line 112L. In some embodiments, a contact area between the resistive element 120 and the conductive line 112L is larger than a contact area between the conductive via 112V and the conductive line 112L, as shown in FIGS. 1H and 2. In some embodiments, the conductive line 112L and the contact opening 118A or 118B extend along substantially the same direction.

Figure 1I:
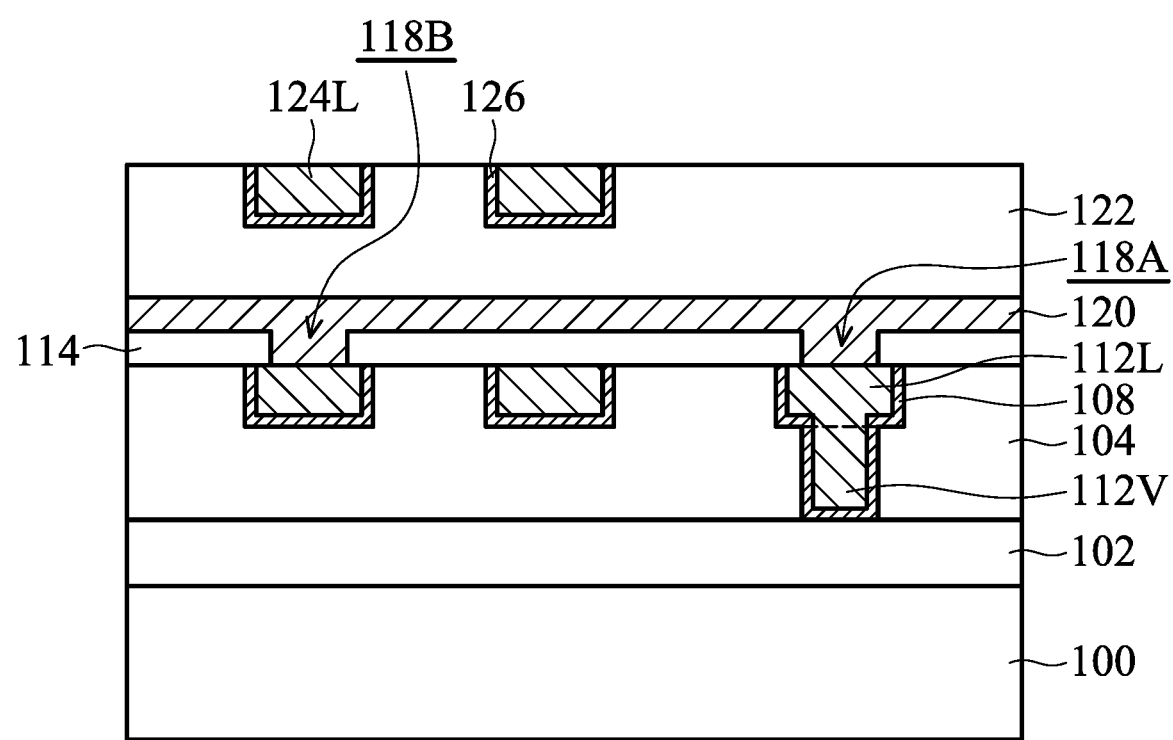

As shown in FIG. 1I, a dielectric layer 122 is deposited over the resistive element 120 and the dielectric layer 114, in accordance with some embodiments. The material and formation method of the dielectric layer 122 may be the same as or similar to those of the dielectric layer 104.

Afterwards, conductive features including conductive lines 124L and a barrier layer 126 are formed in the dielectric layer 122, as shown in FIG. 1I in accordance with some embodiments. Other conductive features such as conductive vias (not shown in FIG. 1I) may be formed in the dielectric layer 122. The formation method for forming feature openings that are used to contain the conductive features may be the same as or similar to that of the trenches 106T and/or the via holes 106V. The material and formation method of the barrier layer 126 may be the same as or similar to those of the barrier layer 108. The material and formation method of the conductive lines 124L may be the same as or similar to those of the conductive lines 112L. In some embodiments, the conductive features (such as the conductive lines 124L) formed in the dielectric layer 122 are electrically isolated from the resistive element 120 by the dielectric layer 122.

Figure 11:
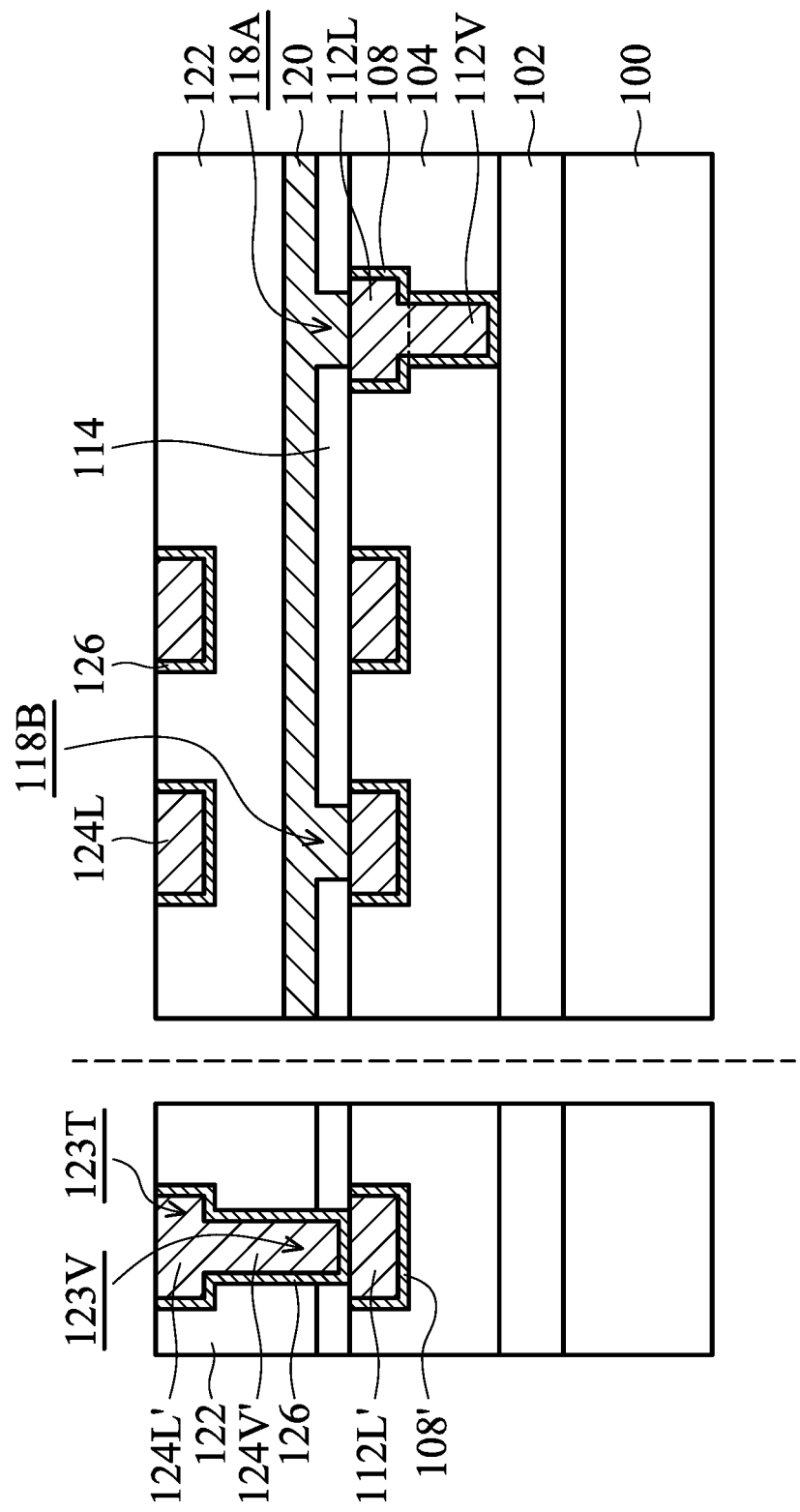
FIG. 11 is a cross-sectional view of a semiconductor device structure, in accordance with some embodiments.

FIG. 11 is a cross-sectional view of a semiconductor device structure, in accordance with some embodiments. In some embodiments, a trench 123T and a via hole 123V are formed in the dielectric layer 122. The via hole 123V penetrates through the dielectric layer 114 to expose a conductive feature thereunder. The conductive feature includes a conductive line 112L' and a barrier layer 108'. The material and formation method of the conductive line 112L' and the barrier layer 108' may be the same as or similar to those of the conductive line 112L and the barrier layer 108. In some embodiments, the conductive line 112L' and the conductive line 112L are simultaneously formed. The formation method of the trench 123T and the via hole 123V may be the same as or similar to those of the trench 106T and the via hole 106V.

As shown in FIG. 11, the barrier layer 126 is also deposited over sidewalls and bottom portions of the trench 123T and the via hole 123V, in accordance with some embodiments. One or more conductive materials are formed in the trench 123T and the via hole 123V to form a conductive via 124V' and a conductive line 124L'. The material and formation method of the conductive via 124V' and the conductive line 124L' may be the same as or similar to those of the conductive via 112V and the conductive line 112L. In some embodiments, the conductive via 124V' is substantially as wide as the conductive via 112V. In some embodiments, the contact opening 118A is wider than the via hole 123V.

In some embodiments, the contact openings 118A and 118B are formed before the via holes 123V. Since the contact openings 118A and 118B are formed in an independent patterning process, the sizes and/or shapes of the contact openings 118A and 118B may be tuned according to the requirement. A larger contact opening may be obtained. The contact area between the resistive element 120 and the conductive lines 112L may be increased to reduce contact resistance, which leads to a more reliable performance.

In some embodiments, there is no conductive via formed directly on the resistive element 120. As shown in FIGS. 11 and 11, the resistive element 120 is electrically connected to the device element formed in or on the semiconductor substrate 100 through underneath conductive features. The resistance mismatch issues may be reduced or prevented. Since no conductive via is formed directly on the resistive element 120, the resistive element 120 does not have to be used as an etch stop layer to assist in the formation of any conductive via. The resistive element 120 is therefore has a better quality.

Figure 3:
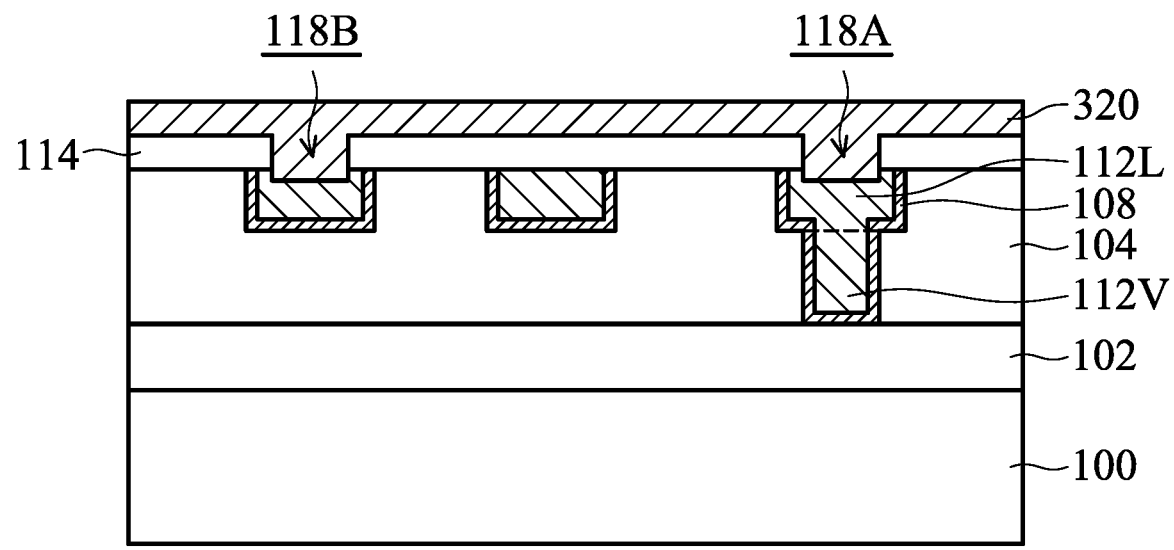
FIG. 3 is a cross-sectional view of a semiconductor device structure, in accordance with some embodiments.

Many variations and/or modifications can be made to embodiments of the disclosure. FIG. 3 is a cross-sectional view of a semiconductor device structure, in accordance with some embodiments. In some embodiments, the contact openings 118A and 118B are formed using an etching process. In some embodiments, an over etch operation is used to ensure that the conductive lines 112L are exposed by the contact openings 118A and 118B. In some embodiments, a portion of the conductive lines 112L is also removed during the over etch operation. As a result, the contact openings 118A and 118B slightly extend into the conductive lines 112L.

Afterwards, a resistive element 320 is formed over the dielectric layer 114 and the conductive lines 112L, as shown in FIG. 3 in accordance with some embodiments. The material and formation method of the resistive element 320 may be the same as or similar to those of the resistive element 120. In some embodiments, the resistive element 320 extends into the conductive lines 112L. The bottom surface of the resistive element 320 is below the top surfaces of the conductive lines 112L. The adhesion between the resistive element 320 and the conductive line 112L thereunder may be improved.

Figure 4:
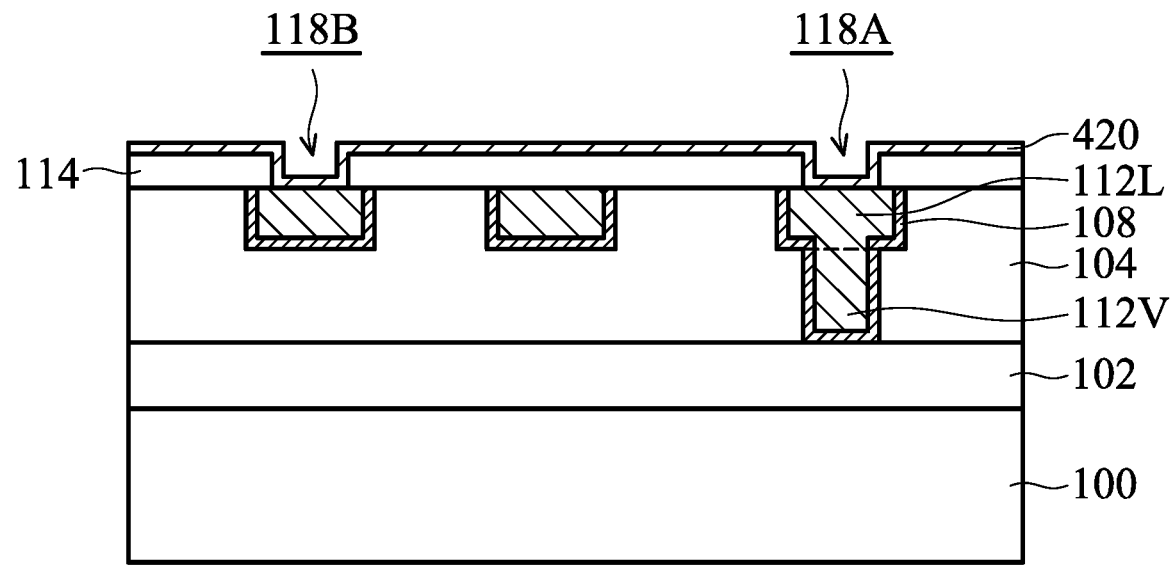
FIG. 4 is a cross-sectional view of a semiconductor device structure, in accordance with some embodiments.

Many variations and/or modifications can be made to embodiments of the disclosure. FIG. 4 is a cross-sectional view of a semiconductor device structure, in accordance with some embodiments. In some embodiments, a resistive layer is conformally formed over the dielectric layer 114. The resistive layer extends conformally on the sidewalls and bottom portions of the contact openings 118A and 118B. Afterwards, the resistive layer is patterned to form a resistive element 420, as shown in FIG. 4. The material and formation method of the resistive element 420 may be the same as or similar to those of the resistive element 120. As shown in FIG. 4, the resistive element 420 includes a U-shape profile or a U-shape-like profile.

Figure 5:
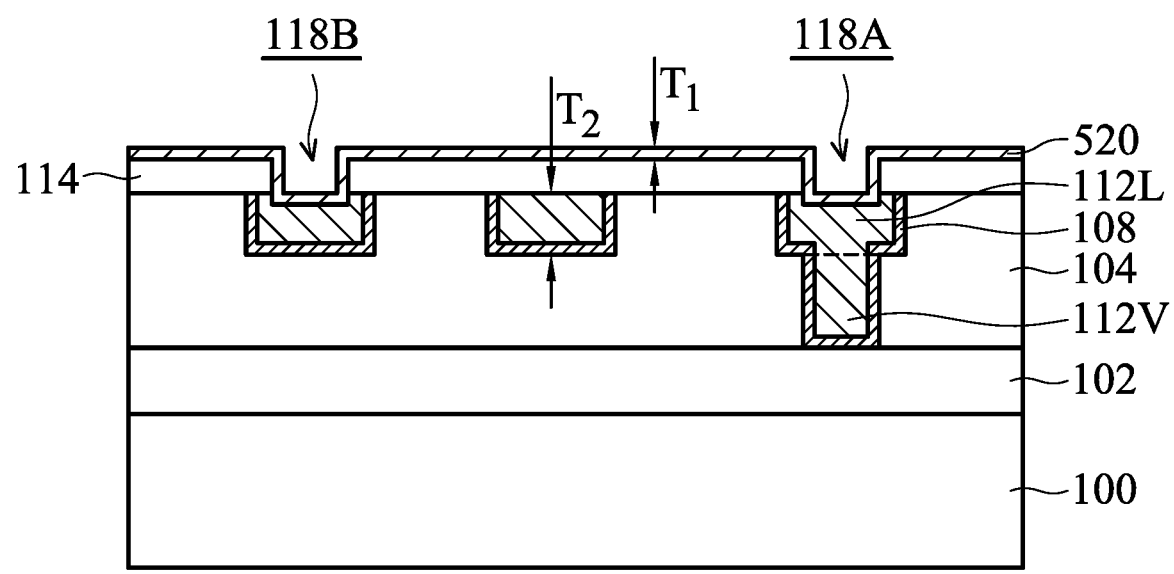
FIG. 5 is a cross-sectional view of a semiconductor device structure, in accordance with some embodiments.

Many variations and/or modifications can be made to embodiments of the disclosure. FIG. 5 is a cross-sectional view of a semiconductor device structure, in accordance with some embodiments. In some embodiments, a resistive element 520 is formed over the dielectric layer 114. The resistive element 520 conformally extends on the sidewalls and bottom portions of the contact openings 118A and 118B. In some embodiments, the resistive element 520 extends into the conductive lines 112L. The material and formation method of the resistive element 520 may be the same as or similar to those of the resistive element 120.

In some embodiments, the resistive element 520 is thinner than the conductive line 112L. For example, the resistive element 520 has a thickness $T_1$, and the conductive line 112L has a thickness $T_2$. In some embodiments, a ratio of the thickness $T_1$ to the thickness $T_2$ ($T_1/T_2$) is in a range from about 1/20 to about 1/15.

Figure 6:
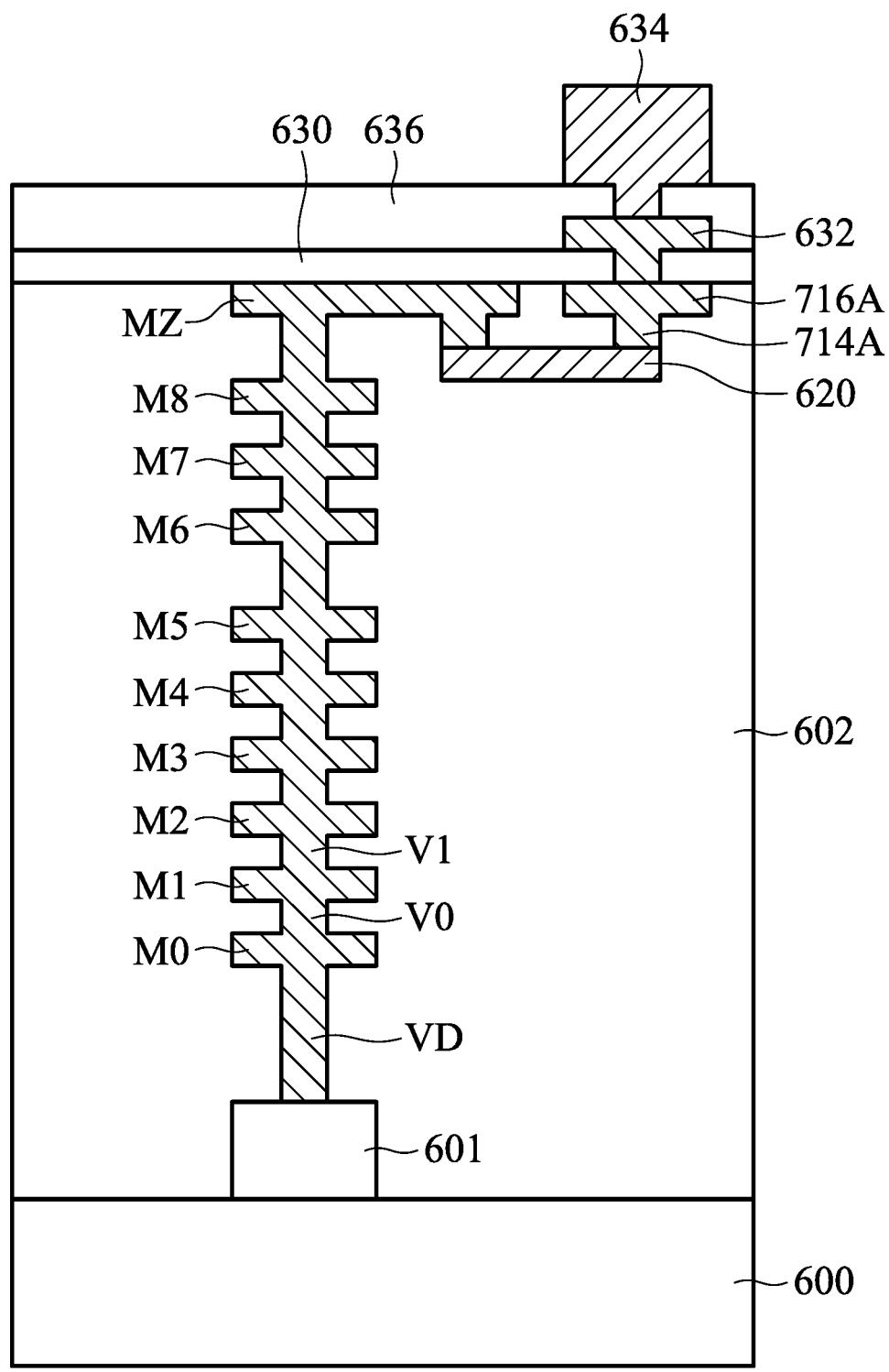
FIG. 6 is a cross-sectional view of a semiconductor device structure, in accordance with some embodiments.

FIG. 6 is a cross-sectional view of a semiconductor device structure, in accordance with some embodiments. The semiconductor device structure includes a semiconductor substrate 600, a device element 601, a dielectric layer 602, and multiple conductive features formed in the dielectric layer 602. The dielectric layer 602 includes multiple sub-layers. The conductive features include a conductive contact VD, multiple conductive vias such as conductive vias V0 and V1, and multiple conductive lines such as conductive lines M0-M8 and top conductive lines MZ.

In some embodiments, the resistive element 620 is formed between a conductive line 716A and the conductive line M8. The conductive line 716A is one of the top conductive lines MZ. A conductive via 714A is formed to electrically connect the conductive line 716A and the resistive element 620. In some embodiments, there is not any conductive line formed between the top conductive line (such as the conductive line 716A) and the conductive line M8.

In some embodiments, a passivation layer 630 is formed over the dielectric layer 620 and the top conductive line MZ and 716A, as shown in FIG. 6. Afterwards, a conductive pad 632 is formed over the conductive line 716A and the passivation layer 630. Afterwards, a protective layer 636 and a conductive bump 634 are formed, as shown in FIG. 6.

In some embodiments, the resistive element 620 is used in high-speed circuit applications. The resistive element 620 has a high sheet resistance, which assist in the high-speed operation of semiconductor devices. Due to the joule heating effect (also known as ohmic heating and resistive heating effect), the resistive element 620 produces heat during the passage of an electric current through the resistive element 620. The heat generated by the resistive element 620 may raise the temperature of nearby conductive features. In some embodiments, the resistive element 620 is positioned near the top conductive line, which is adjacent to the conductive pad 632 and the conductive bump 634. Therefore, heat dissipation may be improved to prevent heat from being accumulated near the resistive element 620. The nearby conductive features are thus prevented from experiencing the electromigration issue which might be enhanced by high temperature. The quality and performance of the semiconductor device structure are therefore improved.

FIGS. 7A-7F are cross-sectional views of various stages of a process for forming a semiconductor device structure, in accordance with some embodiments. FIGS. 8A-8C are top views of various stages of a process for forming a semiconductor device structure, in accordance with some embodiments. In some embodiments, FIG. 8A-8C shows various stages of the process illustrated in FIGS. 7A-7F. FIGS. 7 and 8 show the formation of the resistive element 620, the conductive via 714A, and the conductive line 716A in more detail, in accordance with some embodiments.

Figure 7A:
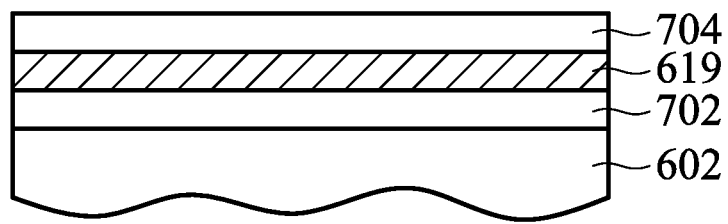
FIGS. 7A-7F are cross-sectional views of various stages of a process for forming a semiconductor device structure, in accordance with some embodiments.
Figure 8A:
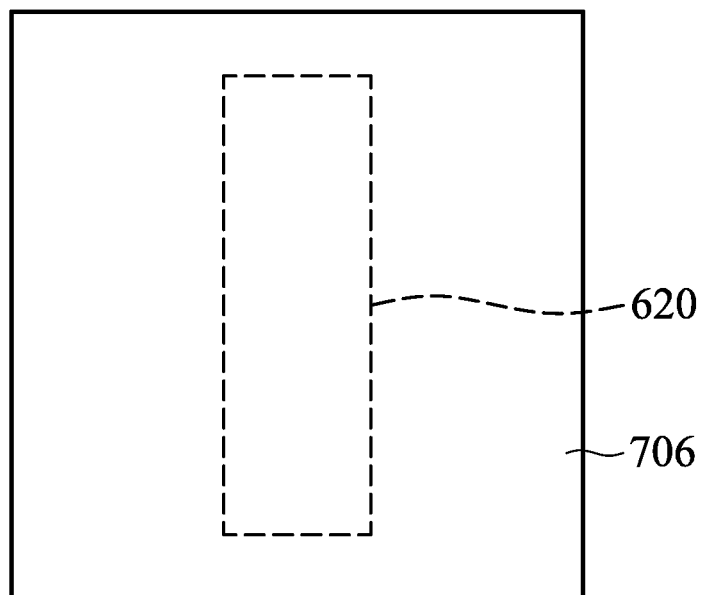
FIGS. 8A-8C are top views of various stages of a process for forming a semiconductor device structure, in accordance with some embodiments.
Figure 8B:
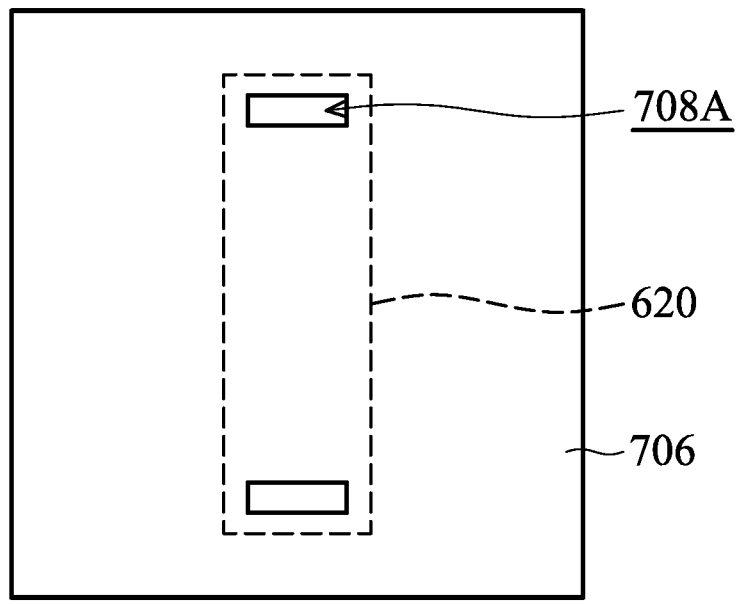
Figure 8C:
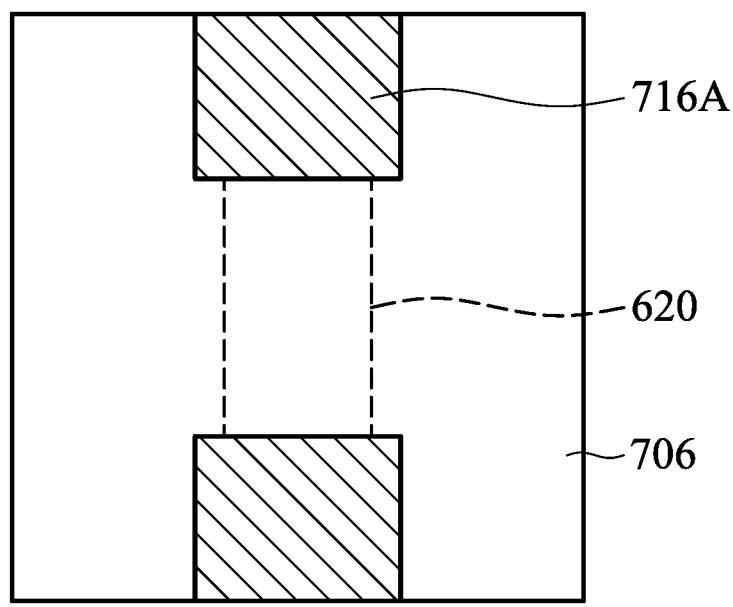

As shown in FIG. 7A, an etch stop layer 702, a resistive layer 619, an etch stop layer 704 are deposited over the dielectric layer 602, in accordance with some embodiments. The material and formation method of the etch stop layers 702 and 704 may be the same as or similar to those of the etch stop layer 114. The resistive layer 619 may be made of or include tantalum nitride, titanium nitride, amorphous silicon, or a combination thereof. The resistive layer 619 may be deposited using a CVD process, an ALD process, a PVD process, one or more other applicable processes, or a combination thereof.

Figure 7B:
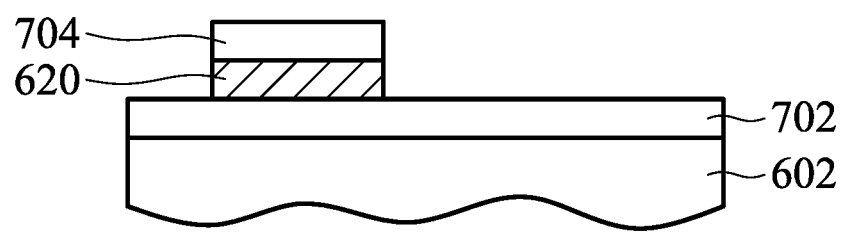

As shown in FIG. 7B, the resistive layer 619 and the etch stop layer 704 are patterned, in accordance with some embodiments. As a result, the resistive layer 619 is patterned to form the resistive element 620. A photolithography process and an etching process may be used to form the resistive element 620.

Figure 7C:
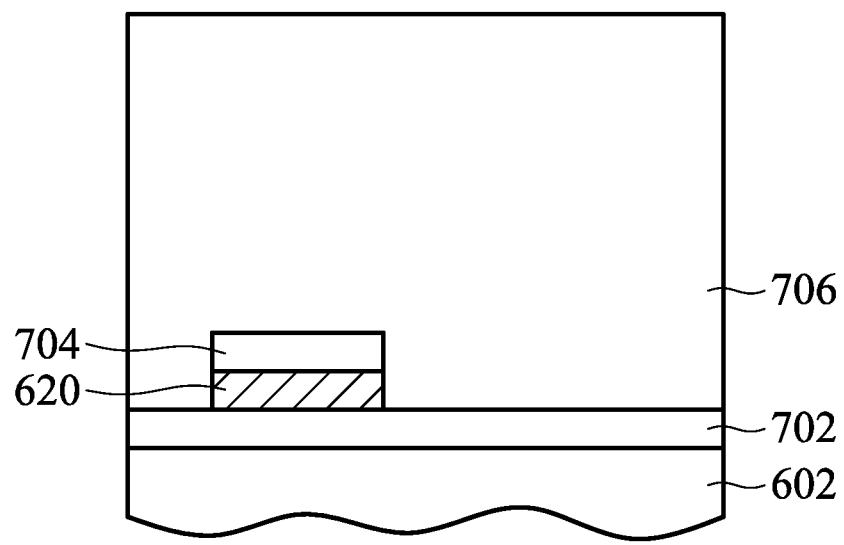

As shown in FIG. 7C, a dielectric layer 706 is deposited over the structure shown in FIG. 7B, in accordance with some embodiments. The material and formation method of the dielectric layer 706 may be the same as or similar to those of the dielectric layer 104. FIG. 8A shows the top view of the structure shown in FIG. 7C, in accordance with some embodiments. The dashed line indicates that the resistive element 620 covered by the dielectric layer 706 and the etch stop layer 704 has a rectangular shape.

Figure 7D:
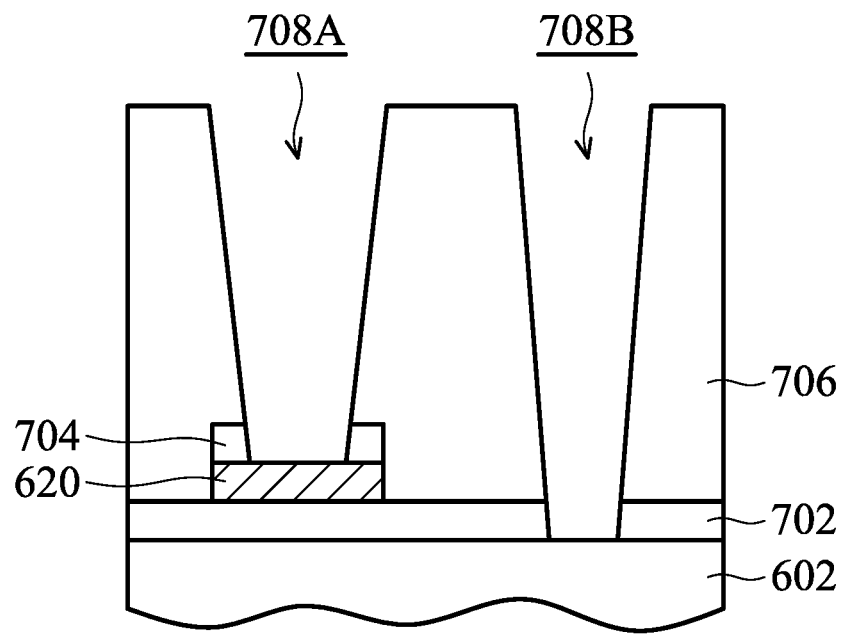

As shown in FIG. 7D, via holes 708A and 708B are formed in the dielectric layer 706, in accordance with some embodiments. The via hole 708A penetrates through the etch stop layer 704 to expose the resistive element 620. The via hole 708B penetrates through the etch stop layer 702 to expose a conductive feature (not shown) formed in the dielectric layer 602. For example, the via hole 708B exposes a conductive line formed in the dielectric layer 602. FIG. 8B shows the top view of a portion of the structure shown in FIG. 7D, in accordance with some embodiments. As shown in FIG. 8B, the relationship between the via hole 708A and the resistive element 620 is shown.

Figure 7E:
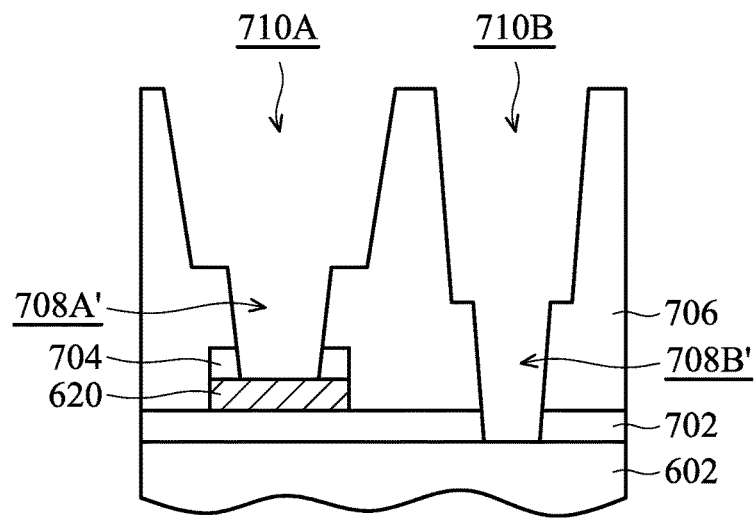

As shown in FIG. 7E, trenches 710A and 710B are formed in the dielectric layer 706, in accordance with some embodiments. After the formation of the trenches 710A and 710B, the profiles of the via holes 708A and 708B may be varied due to the etching process for forming the trenches 710A and 710B. In FIG. 7E, references numbers 708A' and 708B' are used to designate the via holes having varied profiles.

Many variations and/or modifications can be made to embodiments of the disclosure. In some other embodiments, the trenches are formed prior to the formation of the via holes.

Figure 7F:
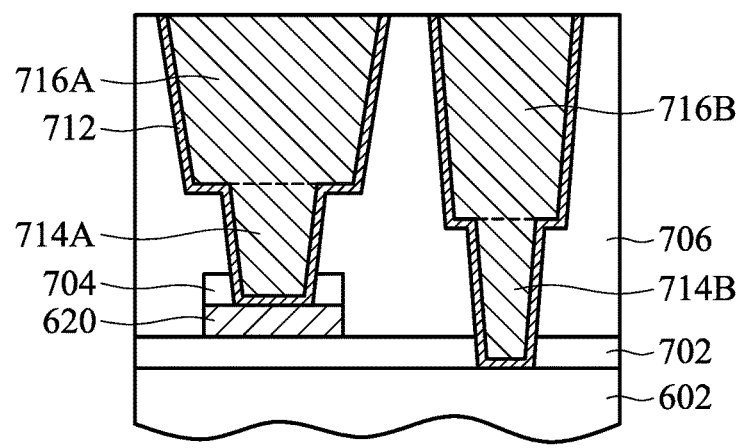

As shown in FIG. 7F, a barrier layer 712 is deposited on sidewalls and bottom portions of the via holes 708A' and the trenches 710A and 710B, in accordance with some embodiments. The material and formation method of the barrier layer 712 may be the same as or similar to those of the barrier layer 108.

Afterwards, conductive vias 714A and 714B and conductive lines 716A and 716B are formed on the barrier layer 712, as shown in FIG. 7F in accordance with some embodiments. The material and formation method of the conductive vias 714A and 714B may be the same as or similar to those of the conductive via 112V. The material and formation method of the conductive lines 716A and 716B may be the same as or similar to those of the conductive lines 112L. FIG. 8C shows the top view of a portion of the structure shown in FIG. 7F, in accordance with some embodiments.

As shown in FIG. 8C, the relationship between the conductive line 716A and the resistive element 620 is shown.

Figure 9:
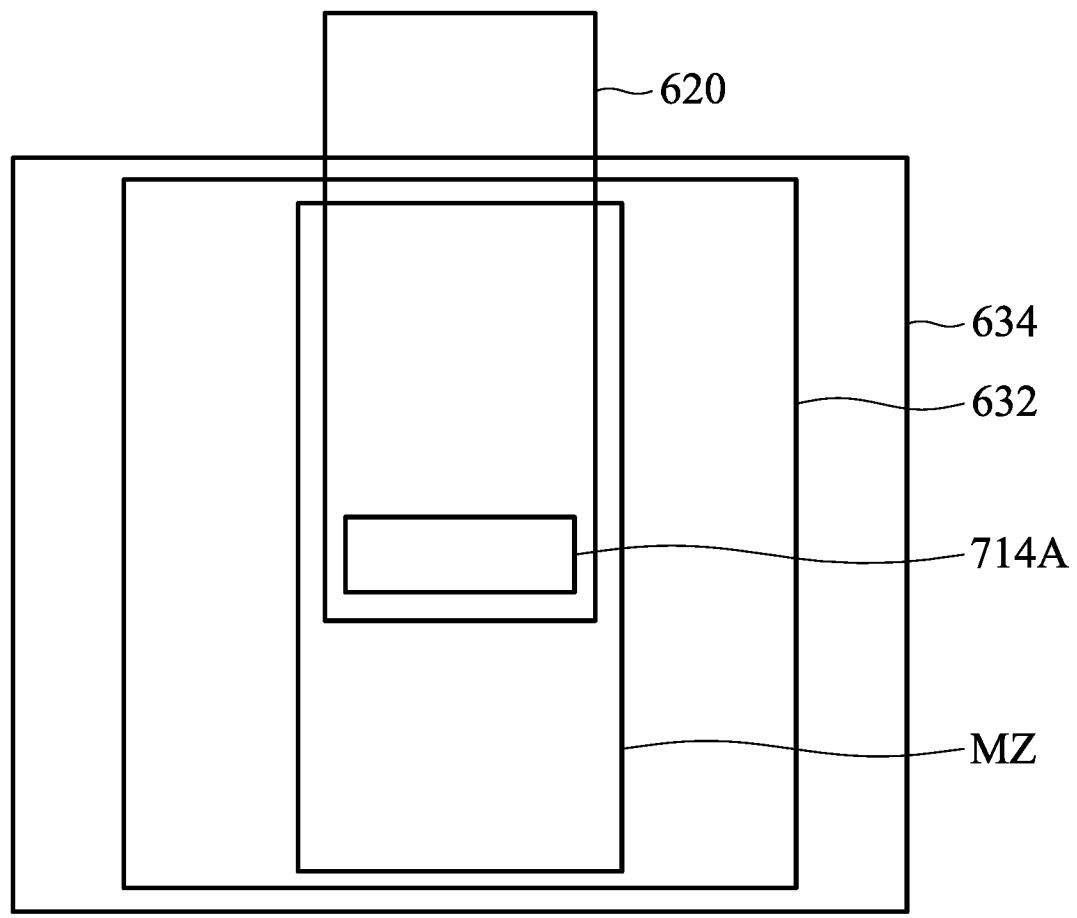
FIG. 9 is a top view of a semiconductor device structure, in accordance with some embodiments.

FIG. 9 is a top view of a semiconductor device structure, in accordance with some embodiments. FIG. 9 shows the relationship between the resistive element 620 and other elements, in accordance with some embodiments. In some embodiments, the conductive via 714A vertically overlaps the top conductive line MZ, the conductive pad 632, and the conductive bump 634. Therefore, heat generated by the resistive element 620 may be lead out more efficiently.

Figure 10:
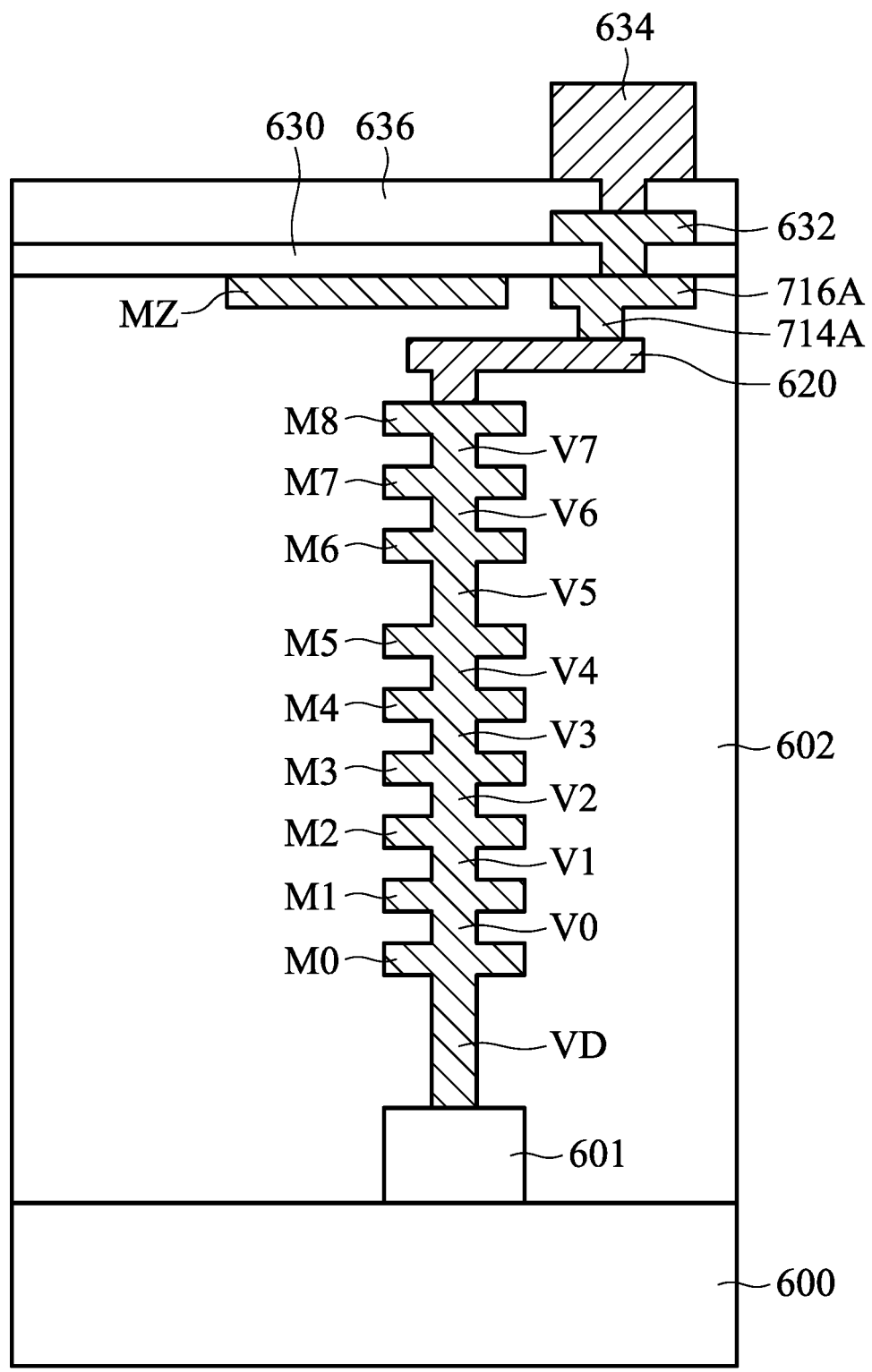
FIG. 10 is a cross-sectional view of a semiconductor device structure, in accordance with some embodiments.

FIG. 10 is a cross-sectional view of a semiconductor device structure, in accordance with some embodiments. In some embodiments, the resistive element 620 is electrically connected to the device element 601 through conductive features directly below the resistive element 620. In some embodiments, the process illustrated in FIGS. 1A-1H is used to form the conductive features directly below the resistive element 620 to establish electrical connection between the resistive element 620 and the device element 601.

Embodiments of the disclosure form a semiconductor device structure with a resistive element. A new contact path through underneath conductive features is used to form electrical connection between the resistive element and a device element. An independent patterning process is used to define contact openings in a dielectric layer (such as an etch stop layer). Afterwards, a resistive element is formed over the etch stop layer. Portion of the resistive element extends into the contact openings and serve as contact portions electrically connecting the underneath conductive features. Due to the independent patterning process, the shapes, sizes, and positions of the contact portions can be adjusted according to the requirement. Because of the new contact path, fewer conductive features are used. The resistance mismatch issues may also be reduced or prevented. The performance and reliability of the resistive element are improved.

In accordance with some embodiments, a semiconductor device structure is provided. The semiconductor device structure includes a semiconductor substrate and a first dielectric layer over the semiconductor substrate. The semiconductor device structure also includes a conductive feature in the first dielectric layer and a second dielectric layer over the first dielectric layer. The semiconductor device structure further includes a resistive element electrically connected to the conductive feature. A first portion of the resistive element is over the second dielectric layer, and a second portion of the resistive element extends towards the conductive feature.

In accordance with some embodiments, a method for forming a semiconductor device structure is provided. The method includes forming a first dielectric layer over a semiconductor substrate and forming a conductive feature in the first dielectric layer. The method also includes forming a second dielectric layer over the first dielectric layer and the conductive feature. The method further includes forming a contact opening in the second dielectric layer to expose the conductive feature. In addition, the method includes forming a resistive element over the second dielectric layer. The resistive element extends into the contact opening to be electrically connected to the conductive feature.

In accordance with some embodiments, a method for forming a semiconductor device structure is provided. The method includes forming a dielectric layer over a semiconductor substrate and forming a conductive line in the dielectric layer. The method also includes forming an etch stop layer over the dielectric layer and the conductive line. The method further includes patterning the etch stop layer to form a contact opening exposing a portion of the conductive line. In addition, the method includes forming a resistive layer over the etch stop layer, and the resistive layer extends into the contact opening. The method also includes patterning the resistive layer to form a resistive element.

In accordance with some embodiments, a semiconductor device structure is provided. The semiconductor device structure includes a semiconductor substrate and a conductive feature over the semiconductor substrate. The semiconductor device structure also includes a dielectric layer over the semiconductor substrate and surrounding the conductive feature. The semiconductor device structure further includes a second dielectric layer over the dielectric layer. In addition, the semiconductor device structure includes a resistive element over the second dielectric layer. The resistive element penetrates through the second dielectric layer and is electrically connected to the conductive feature.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
  a semiconductor substrate;
  a first dielectric layer over the semiconductor substrate;
  a conductive feature in the first dielectric layer;
  a barrier layer in the first dielectric layer, wherein the barrier layer is between the first dielectric layer and the conductive feature, the barrier layer contains nitrogen, and the barrier layer has a first atomic concentration of nitrogen;
  a second dielectric layer over the first dielectric layer; and
  a resistive element electrically connected to the conductive feature, wherein a first portion of the resistive element is over the second dielectric layer, a second portion of the resistive element extends towards the conductive feature, the resistive element has a second atomic concentration of nitrogen, and the second atomic concentration of nitrogen is greater than the first atomic concentration of nitrogen.

2. The semiconductor device structure as claimed in claim 1, wherein the resistive element conformally covers a top surface and a side surface of the second dielectric layer.

3. The semiconductor device structure as claimed in claim 1, further comprising a conductive via in the first dielectric layer, wherein the conductive via is electrically connected to the conductive feature, and a contact area between the resistive element and the conductive feature is larger than a contact area between the conductive via and the conductive feature.

4. The semiconductor device structure as claimed in claim 1, wherein the second dielectric layer is made of a different material than that of the first dielectric layer, and the second dielectric layer is thinner than the first dielectric layer.

5. The semiconductor device structure as claimed in claim 1, further comprising a third dielectric layer over the resistive element, wherein an entirety of a top surface of the resistive element is in direct contact with the third dielectric layer.

6. The semiconductor device structure as claimed in claim 1, further comprising:
  a third dielectric layer over the resistive element; and
  a second conductive feature in the third dielectric layer, wherein the second conductive feature is electrically isolated from the resistive element by the third dielectric layer.

7. The semiconductor device structure as claimed in claim 1, wherein a portion of the resistive element extends into the conductive feature.

8. The semiconductor device structure as claimed in claim 1, wherein the resistive element comprises tantalum nitride, titanium nitride, or a combination thereof.

9. A semiconductor device structure, comprising:
  a semiconductor substrate;
  a conductive feature over the semiconductor substrate;
  a dielectric layer over the semiconductor substrate and surrounding the conductive feature;
  a barrier layer between the dielectric layer and the conductive feature, wherein the barrier layer contains nitrogen, and the barrier layer has a first atomic concentration of nitrogen;
  a second dielectric layer over the dielectric layer; and
  a resistive element, wherein a portion of the resistive element is over the second dielectric layer, the resistive element penetrates through the second dielectric layer and is electrically connected to the conductive feature, the resistive element has a second atomic concentration of nitrogen, and the second atomic concentration of nitrogen is greater than the first atomic concentration of nitrogen.

10. The semiconductor device structure as claimed in claim 9, wherein the resistive element extends into the conductive feature such that a bottom surface of the resistive element is below a top surface of the conductive feature.

11. The semiconductor device structure as claimed in claim 9, wherein the resistive element has a substantially planar top surface.

12. The semiconductor device structure as claimed in claim 9, wherein the second dielectric layer has a contact opening, the contact opening penetrates through the second dielectric layer and is aligned with the conductive feature, and the resistive element conformally extends along a sidewall of the contact opening and a top surface of the conductive feature.

13. The semiconductor device structure as claimed in claim 9, further comprising a conductive via electrically connected to the conductive feature, wherein a contact area between the resistive element and the conductive feature is larger than a contact area between the conductive feature and the conductive via.

14. A semiconductor device structure, comprising:
  a semiconductor substrate;
  a conductive feature over the semiconductor substrate;
  a dielectric layer surrounding the conductive feature;
  a barrier layer between the dielectric layer and the conductive feature, wherein the barrier layer contains nitrogen, and the barrier layer has a first atomic concentration of nitrogen;
  a second dielectric layer over the dielectric layer; and
  a resistive element penetrating through the second dielectric layer and electrically connected to the conductive feature, wherein the resistive element has a second atomic concentration of nitrogen, and the second atomic concentration of nitrogen is greater than the first atomic concentration of nitrogen.

15. The semiconductor device structure as claimed in claim 14, wherein a portion of the resistive element covers a top surface of the second dielectric layer.

16. The semiconductor device structure as claimed in claim 14, further comprising a second conductive feature surrounded by the dielectric layer, wherein the resistive element is electrically connected to the second conductive feature.

17. The semiconductor device structure as claimed in claim 16, wherein the resistive element extends into the conductive feature and the second conductive feature.

18. The semiconductor device structure as claimed in claim 14, further comprising a conductive via electrically connected to the conductive feature, wherein a contact area between the resistive element and the conductive feature is larger than a contact area between the conductive feature and the conductive via.

19. The semiconductor device structure as claimed in claim 14, wherein the resistive element comprises tantalum nitride, titanium nitride, or a combination thereof.

20. The semiconductor device structure as claimed in claim 14, wherein the second dielectric layer has a contact opening, and the resistive element completely filling the contact opening of the second dielectric layer.

* * * * *